United States Patent [19]

Corzine et al.

[11] Patent Number: 4,609,888

[45] Date of Patent: Sep. 2, 1986

[54] DIRECTION FINDING ANTENNA INTERFACE

[75] Inventors: Robert G. Corzine; Joseph A. Mosko, both of Ridgecrest, Calif.

[73] Assignee: The United States of America as represented by the Secretary of the Navy, Washington, D.C.

[21] Appl. No.: 193,567

[22] Filed: Oct. 2, 1980

[51] Int. Cl.[4] ........................ H03H 7/38; H01Q 9/27

[52] U.S. Cl. ........................................ 333/34; 29/601; 343/895

[58] Field of Search ................................ 333/34, 246; 29/600 (U.S. only), 601; 343/700 MS, 863, 852, 895 (U.S. only)

[56] References Cited

U.S. PATENT DOCUMENTS

| | | | |
|---|---|---|---|
| 3,013,265 | 12/1961 | Wheeler | 343/113 R |
| 3,039,099 | 6/1962 | Chait et al. | 343/895 X |
| 3,137,002 | 6/1964 | Kaiser, Jr. et al. | 343/895 X |
| 3,209,287 | 9/1965 | Oxner et al. | 333/34 |
| 3,381,371 | 5/1968 | Russell | 29/600 |
| 3,534,299 | 10/1970 | Eberhardt | 333/246 X |
| 3,715,689 | 2/1973 | Laughlin | 333/246 X |
| 4,280,112 | 7/1981 | Eisenhart | 333/34 X |
| 4,309,706 | 1/1982 | Mosko | 343/895 X |
| 4,315,266 | 2/1982 | Ellis, Jr. | 343/895 |

*Primary Examiner*—T. H. Tubbesing
*Attorney, Agent, or Firm*—Robert F. Beers; W. Thom Skeer

[57] ABSTRACT

A microwave direction finding antenna interface is disclosed which is capable of operating over multioctave bandwidth with an upper frequency limit exceeding forty gigahertz. The antenna, feed circuit/transformer and arithmetic network have non-interrupted TEM electrical paths of strip transmission lines (striplines). Further, a process of fabricating the antenna, feed circuit/transformer and arithmetic network in conjunction with the support means is described.

11 Claims, 5 Drawing Figures

DIRECTION FINDING ANTENNA INTERFACE

BACKGROUND OF THE INVENTION

1. Field of the Invention

This invention relates to an antenna interface and a method of unifying the elements thereof and more particularly, it relates to a broadband direction finding antenna interface wherein the components are so connected that the upper most operating frequency can exceed forty gigahertz.

2. Description of the Prior Art

Previous to this invention, the radio frequency detected by the direction finding antenna was transformed at each antenna arm termination to a semirigid coaxial transmission line and thereafter to an arithmetic network where appropriate signal processing occurred before the signal was sent to the guidance control system. Both the antenna arms and the arithmetic network were constructed of strip transmission lines (striplines). This resulted in two stripline-to-coaxial interfaces per antenna arm. Because of fabricating limitations, the phase and amplitude matching of coaxial lines, stripline-to-coaxial transitions, and coaxial connections constrained the operating frequencies to those below eighteen gigahertz.

SUMMARY OF THE INVENTION

In the preferred embodiment, the direction finding antenna is a four-arm planar spiral antenna. The arms are striplines and are spirally disposed about a central area where the antenna arm output terminations are located. Each spiral arm output termination is unitarily connected to one stripline feed circuit/transformer. Each feed strip of the stripline feed circuit/transformer is unitarily connected to one stripline input of an arithmetic network. The arithmetic network utilized is of a peculiar design performing arithmetic operations upon the four input signals such as taking the difference or sum of the input signals. These processed signals provide guidance information to a guidance control system. The peculiar shape of the striplines making up the arithmetic network is not critical to this invention, other than having four stripline inputs, and has been mentioned to clarify understanding as to making and using this invention. The four feed strips of the feed circuit/transformer serve to connect the antenna to the arithmetic network forming a four stripline-impedance transformer. Because the radiation impedance of the four-arm spiral planar antenna is different for each of the two radiation modes inherent in a four-arm spiral antenna direction finding system, the four stripline-impedance transformer optimizes the impedance match between the four-arm spiral antenna and the arithmetic network for each of the radiation modes.

There are several objects of this invention. One object of this invention is the computer controlled production of all stripline circuits. Another object is a direction finding system with consistent and reliable operation which is critical if the direction finding system is used in a missile homing system. Another object is the highest possible fidelity signals. This is very critical since any significant distortion would interfere with the arithmetic operations performed in the arithmetic network. Replacement of the coaxial lines between the antenna and the arithmetic network with the computer controlled generation of the four feed striplines significantly reduces signal distortion because stripline lengths and widths are computer controlled, discontinuities at the stripline-to-coaxial transition are removed, and discontinuities at the coaxial coupling are eliminated. This elimination of the manual fabrication of coaxial lines and connectors also reduces cost.

DESCRIPTION OF THE PREFERRED EMBODIMENT

Figure 1:
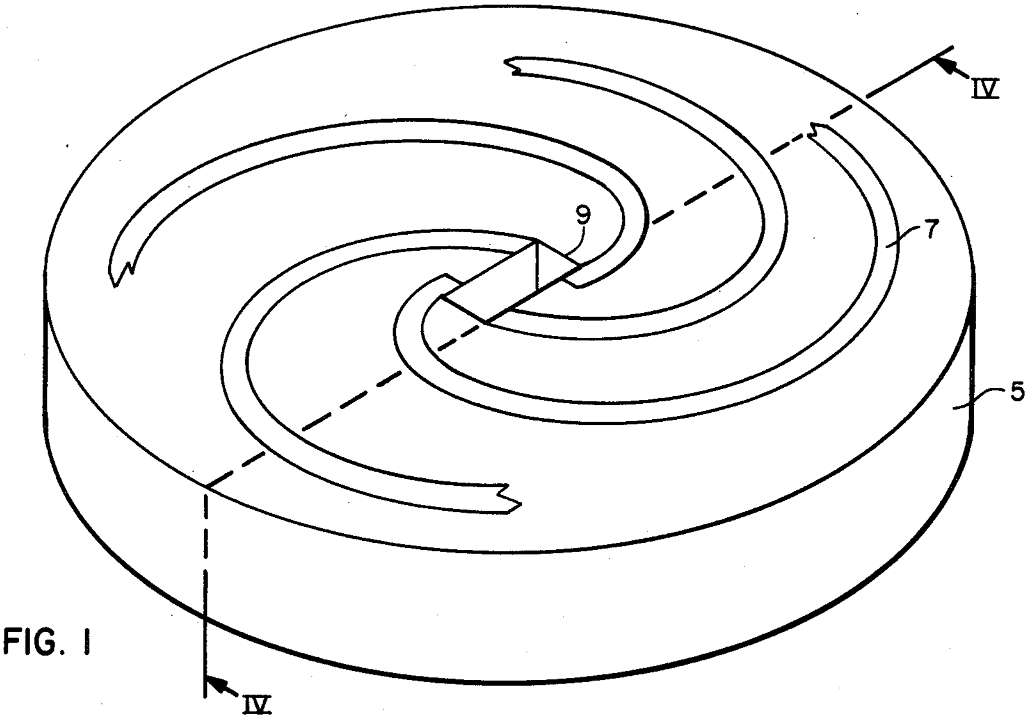
FIG. 1 illustrates a perspective view of the four-arm planar spiral direction finding antenna.
Figure 4:
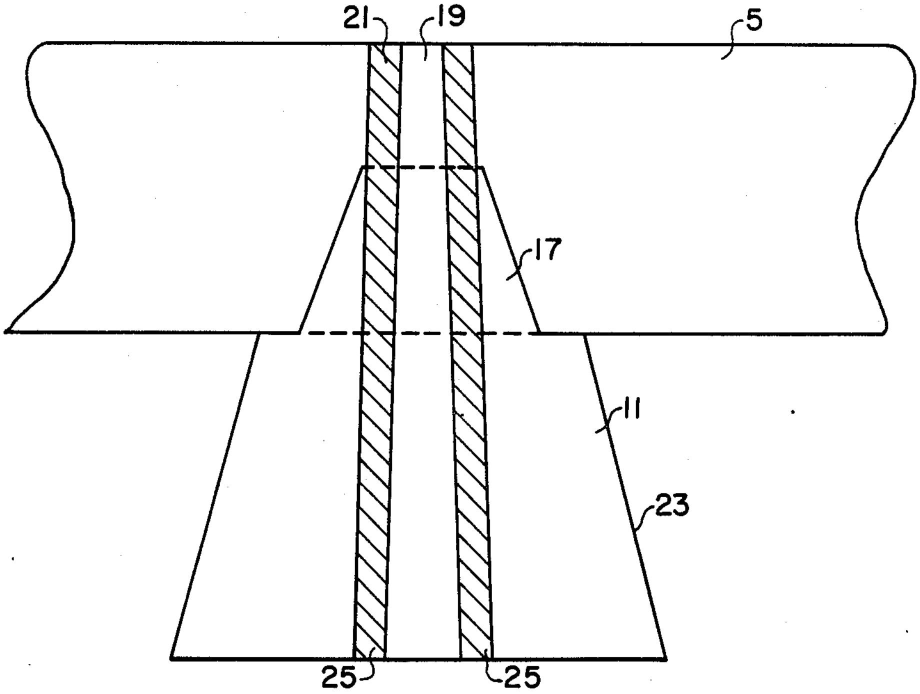
FIG. 4 illustrates a cross-sectional elevation view taken through line IV—IV of FIGS. 1, 2, and 3 after assembling the structures illustrated in FIGS. 1 and 2.

FIG. 1 illustrates the pertinent region of a four-arm planar spiral direction finding antenna interface. Spiral arm 7 is composed of conductive material disposed upon first dielectric substrate 5. The exact dimensions of the stripline spiral arm such as spiral arm 7 are computer generated and the arms are proximally positioned about a central area. This central area is rectangular shaped feed aperture 9 as seen in FIG. 1. As illustrated in FIG. 1, the output terminations of the spiral arms terminate at the edges of feed aperture 9. Feed aperture 9 is initally shaped as a rectangular parallelepiped in first dielectric substrate 5 but changes to a void shaped as a truncated right circular cone as illustrated in FIG. 4 so as to conform in shape to the feed circuit/transformer support means of FIG. 2. Typical dimensions of the top surface of feed aperture 9 are noted as follows: If the width of the rectangular aperture is w, the length is three w. An equal number of the spiral arms terminate on the longest side of the rectangle. The approximate termination output width of the spiral arm is w in relation to the rectangle. A distance of w thus existing between the two spiral arm output terminations on the longest sides of feed aperture 9. In this invention w is equal to about 0.010 inches.

It is within the scope of this invention that a stripline antenna having any number of arms could be connected as shown and described. A two arm antenna would be shown by the elimination of any opposing pair of the four arms. The spiral configuration with four arms was a requirement dictated by the direction finding purpose.

Figure 2:
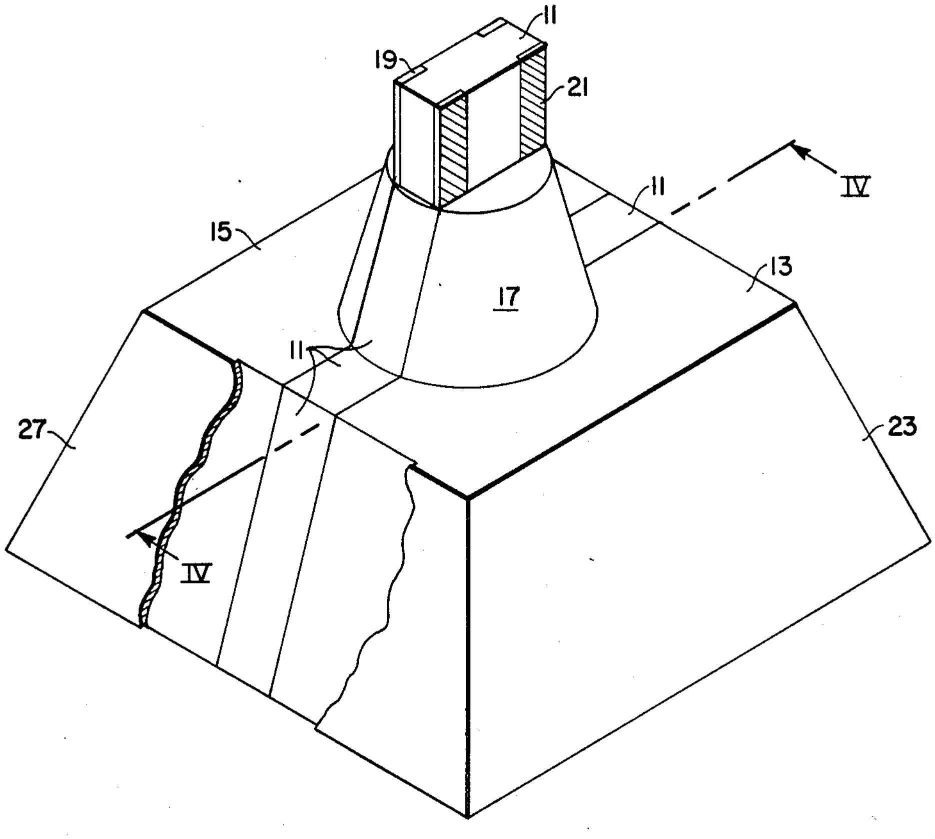
FIG. 2 illustrates a perspective view of the feed circuit/transformer support means being composed of the support pedestal, conical support/alignment guide and the feed aperture insert.

According to FIG. 2, the feed circuit/transformer support means for transferring the radio frequency signal from the antenna to the arithmetic network are illustrated. The support means provide a rigid structure and provide a surface on which the stripline feed circuit/transformer is disposed.

Seimirigid coaxial lines have been used to connect the arithmetic network input terminations to the antenna output terminations. The cross-sectional area taken perpendicular to the center axis of the coaxial lines is approximately three times greater than in the present invention. This one improvement significantly increases the uppermost operating frequency limit of the direction finding system from eighteen gigahertz to well above forty gigahertz.

As illustrated in FIG. 2, the stripline feed circuit/transformer support means is composed of:

support pedestal 27, consisting of a multi-trapezoidal shaped slab of second dielectric substrate 11 supported on each broad side by trapezoidal shaped blocks of third dielectric substrate 13 and fourth dielectric substrate 15;

conical support/alignment guide 17, likewise consisting of second dielectric substrate 11 supported on each broad side by truncated conical extensions of third dielectric substrate 13 and fourth dielectric substrate 15;

feed aperture insert 19, consisting solely of second dielectric substrate 11; and feed strip 21 of which only two of the four are shown in FIGS. 2 and 4.

The four feed strips of the feed circuit/transformer serve to interconnect the antenna to the arithmetic network thus forming a four stripline-impedance transformer. Because the radiaton impedance of the four-arm planar spiral antenna is different for each of the two radiation modes inherent in a four-arm spiral antenna, the four stripline-impedance transformer optimizes the impedance match between the four-arm spiral antenna and the arithmetic network for each of the radiation modes by controlling the exact widths, relative spacings, and lengths of the striplines. The four outside slanting surfaces of support pedestal 27 are covered by a conducting ground plane 23, illustrated in cutaway view in FIG. 2 for clarity in understanding the underlying structure. Feed aperture insert 19 is in the shape of a rectangular parallelepiped. As noted above, the approximate width is w and the length is three w. The height is about three to five w. A cylindrical shape would not be appropriate since the striplines would have to be formed on a curved surface. This would significantly complicate the connection of feed strip 21 to spiral arm 7 as well as the arithmetic network. Feed aperture insert 19 is an integral part of second dielectric substrate 11. Conical support/alignment guide 17 is in the shape of a truncated right circular cone. This cone is composed of second dielectric substrate 11, third dielectric substrate 13 and fourth dielectric substrate 15. The conical shape insures that the feed aperture insert 19 is positioned correctly in feed aperture 9. It further provides structural support to first dielectric substrate 5. Support pedestal 27 is also composed of second dielectric substrate 11, third dielectric substrate 13 and fourth dielectric substrate 15. The top of the truncated pyramid of support pedestal 27 serves to support first dielectric substrate 5, feed aperture insert 19 and conical support/alignment guide 17. The shape of these structures must conform closely to the void formed in first dielectric substrate 5. This interface is illustrated in FIG. 4.

Figure 3:
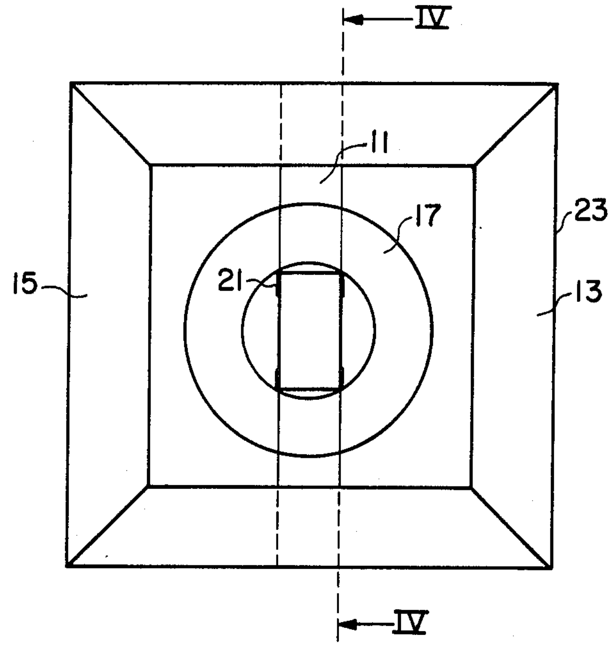
FIG. 3 illustrates a plan view of the support means illustrated in FIG. 2.

FIG. 3 illustrates a plan view of the stripline feed circuit/transformer support means of FIG. 2. The dotted lines of FIG. 3 are the physical interfaces between second dielectric substrate 11, third dielectric substrate 13, and fourth dielectric substrate 15. In this view, the tops of the four feed strips are shown, feed strip 21 being one.

FIG. 4 illustrates a cross-sectional elevational view taken along line IV—IV of FIG. 1, FIG. 2, and FIG. 3 after first dielectric substrate 5 is attached to the stripline feed circuit/transformer support means. This cross-section is taken at the interface between second and third dielectric substrates 11 and 13 respectively.

Figure 5:
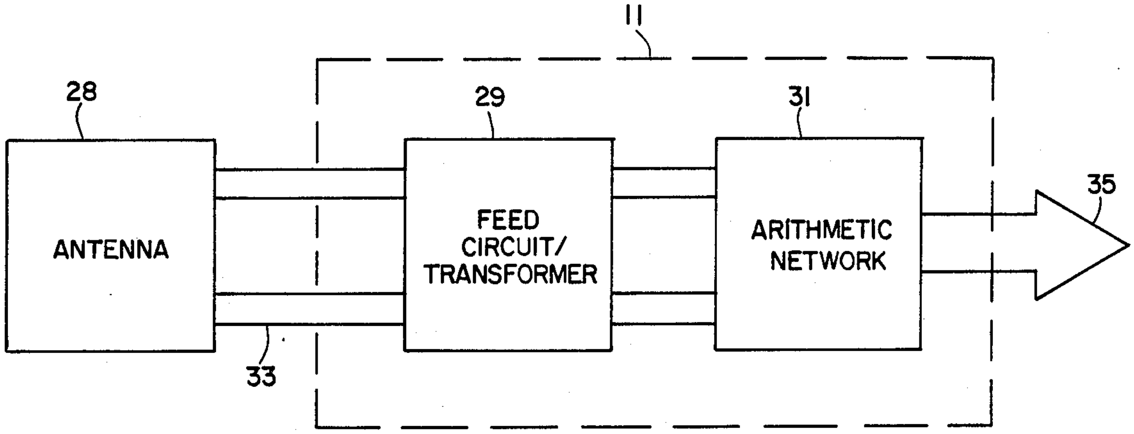
FIG. 5 illustrates a block flow diagram of the direction finding antenna system.

FIG. 5 illustrates a block flow diagram of this invention. Antenna 28 feeds signals to feed circuit/transformer 29 which feeds the signals to arithmetic network 31. The resulting control signals 35 are input into the guidance control systems. Transmission line 33 being one of four connecting antenna 28 to the feed circuit/transformer 29. Second dielectric substrate 11 is shown as having the feed circuit/transformer 29 and arithmetic network 31 formed upon it. These stripline circuits are formed simultaneously or can be formed on separate dielectric substrates and then electrically connected. In the preferred embodiment, feed circuit/transformer 29 and arithmetic network 31 are formed simultaneously upon one side of second dielectric substrate 11. The other part of feed circuit/transformer 29 and arithmetic network 31 is formed similarly upon the opposite side of second dielectric substrate 11. Critical electrical connections are thus minimized to the interfaces at antenna 28 and the guidance control system.

The feed circuit/transformer support means illustrated in the preferred embodiment is one support means found to be operable. Other support means providing a rigid structure and a support surface for the striplines would be mechanically equivalent to that disclosed.

In the construction of the direction finding interface, several methods evolved that contributed to the effectiveness of this design.

One of the first steps is the forming of first dielectric substrate 5 into a desired shape upon which antenna 28 is etched. This is principally concerned with the forming of feed aperture 9. The void nearest spiral arm 7 output termination is a rectangular parallelepiped into which feed aperture insert 19 is placed. The approximate dimensions of this structure are noted in the above discussion about feed aperture 9. The void beneath is in the shape of a truncated right circular cone into which conical support/alignment guide 17 is placed. The top of the truncated pyramid, pedestal support 27, contacts the bottom surface of first dielectric substrate 5. A cross-section in FIG. 4 illustrates the physical interfaces of these structures. The above voids can be formed by machining or other conventional methods of removing dielectric material.

After forming first dielectric substrate 5 in a desired shape upon which the antenna is to be disposed, antenna 28 is etched upon a planar surface having a common plane with rectangular feed aperture 9. Spiral arm 7, as shown, is one arm of antenna 28. A photomask having the image of the antenna arms is positioned so that the arms terminate at the edge of feed aperture 9 in the manner illustrated in FIG. 1. Using conventional etching techniques, the antenna arms, such as spiral arm 7, are etched upon first dielectric substrate 5. Though this method was found very suitable, perhaps some applications might call for forming feed aperture 9 after etching the antenna upon the dielectric.

The feed circuit/transformer 29 must be electrically connected to antenna 28. The structure supporting feed circuit/transformer 29 is described next. Second dielectric substrate 11 is formed to a desired shape. The shape nearest antenna 28 is a rectangular parallelpiped as illustrated by feed aperture insert 19 of FIG. 2. Attached to feed aperture insert 19 is a truncated prism sandwiched in the middle of conical support/alignment guide 17. Attached to this is another truncated prism sandwiched in the middle of pedestal support 27. Second dielectric substrate 11 can be machined or cut by any conventional means which does not damage the substrate. Feed circuit/transformer 29 is then etched upon second dielectric substrate 11 as shown in FIG. 4. Feed strip 21 is one of two shown per side.

The approximate design of stripline feed circuit/transformer 29 is illustrated in FIG. 4. The exact widths, spacings, and lengths are controlled by an analysis based upon microwave principles so as to impedance match antenna 28 to the arithmetic network 31. The desired design of feed circuit/transformer 29 optimizes impedance matching by controlling the widths and the lengths of the striplines. Because the radiation impedance of four-arm planar spiral antenna 28 is different for each of the two radiation modes inherent in a four-arm spiral antenna, the four-stripline-impedance transformer 29 optimizes the impedance match between four-arm spiral antenna 28 and arithmetic network 31 for each of the radiation modes. Photomasks having the images of the stripline feed circuit/transformer are positioned so that the input terminations of feed strip 21, being one of four, are correctly positioned on feed aperture insert 19 as illustrated in FIGS. 2, 3, and 4. Stripline feed circuit/transformer 29 is etched upon second dielectric substrate 11 using conventional etching techniques.

In order to simplify construction of the direction finding antenna interface and also preserve signal fidelity, second dielectric substrate 11 can be extended to include arithmetic network 31. Photomasks containing the images of both stripline feed circuit/transformer 29 and arithmetic network 31 can be made. These can be positioned as noted above. If this preferred method is used, the step of electrically connecting stripline feed circuit/transformer 29 to arithmetic network 31 is eliminated. Nevertheless, should the arithmetic network be not suitably disposed for direct integration with the feed network/transformer (for example, an existing arithmetic network may be essentially planar, such as when designed using conventional microstrip techniques), the two circuits can still be electrically joined with suitable conductor ribbons and thus gain most of the beneficial properties of the method.

After stripline feed circuit/transformer 29 and arithmetic network 31 are etched upon second dielectric substrate 11, third and fourth dielectric substrates 13 and 15 are formed to a shape to fit upon the opposite sides of second dielectric substrate 11. Their approximate shapes are illustrated in FIGS. 2 and 3. After the bonding of second dielectric substrate 11 to third and fourth dielectric substrates 13 and 15, the support means shape is formed to securely fit within the voids of first dielectric substrate 5 as described above.

Ground plane 23 is secured fixedly by suitable bonding such as glue to the slanting sides of pedestal support 27.

At this point in the process, support means composed of second dielectric substrate 11, third dielectric substrate 13 and fourth dielectric substrate 15 is secured to first dielectric substrate 5 by bonding with a suitable glue.

Feed strip 21, being one of four, is electrically connected to spiral arm 7 by conventional soldering or welding. The arithmetic network if formed as noted above is then electrically connected to the guidance control system.

The foregoing description taken together with the appended claims constitute a disclosure such as to enable a person skilled in the electronic and microwave arts having benefit of the teachings contained therein to make and use the invention. Further, the structure and process herein described generally constitute a meritorious advance in the art unobvious to such an artisan not having the benefit of these teachings.

What is claimed is:

1. A direction finding antenna interface for receiving, impedance transforming, and transmitting signals to an arithmetic network comprising:

antenna means having a plurality of arms for receiving signals;

a stripline feed circuit/transformer connected between the antenna means and the arithmetic network for impedance optimization of the different radiation modes by controlling the widths, lengths, and the spacings of the striplines; and stripline feed circuit/transformer support means connected to the antenna means for fixedly holding the stripline feed circuit/transformer between the antenna means and the arithmetic network.

2. A direction finding antenna interface as in claim 1, wherein the plurality of arms of the antenna means is limited to four arms.

3. A direction finding antenna interface as in claim 1, wherein each arm of the plurality of arms comprises a ribbon strip of conductive material disposed upon a first dielectric substrate.

4. A direction finding antenna interface as in claim 1, wherein the stripline feed circuit/transformer comprises a plurality of feed strips.

5. A direction finding antenna interface as in claim 4, wherein the plurality of feed strips comprises four feed strips, each feed strip being a ribbon of conductive material disposed upon a second dielectric substrate.

6. A direction finding antenna interface as in claim 1, wherein each arm of the plurality of arms is positioned in a common plane, each arm of the plurality being unitarily connected respectively to one feed strip of the stripline feed circuit/transformer.

7. A direction finding antenna interface as in claim 1, wherein the stripline feed circuit/transformer support means comprises:

a dielectric substrate to fixedly hold the arithmetic network in addition to the feed circuit/transformer.

8. A method of constructing a direction finding antenna interface having an antenna with a plurality of arms, a stripline feed circuit/transformer with a plurality of feed strips and an arithmetic network disposed upon support means comprising the steps of:

forming the first dielectric substrate upon which the antenna is disposed;

etching the antenna upon the first dielectric substrate;

forming a second dielectric substrate in a shape upon which the stripline feed circuit/transformer is disposed;

etching the stripline feed circuit/transformer upon the opposite sides of the second dielectric substrate, the stripline feed circuit/transformer being designed to optimize the impedance matching between the antenna and the arithmetic network;

forming a third and fourth dielectric substrate in a shape to be attached to each broad side of the second dielectric substrate;

securing fixedly to each other the second, third and fourth dielectric substrates;

securing fixedly ground plane means to the first, second, third and fourth dielectric substrates;

securing fixedly the first dielectric substrate to the second, third, and fourth dielectric substrates;

electrically connecting the stripline feed circuit/-transformer to the arms of the antenna; and electrically connecting the stripline feed circuit/-transformer to the arithmetic network.

9. A method of constructing the direction finding antenna interface as in claim 8, wherein after the step of etching the antenna the following step is performed rather than in the first step:

forming an aperture through the first dielectric substrate so that the plurality of arms terminate at the edge of the aperture.

10. A method of constructing the direction finding antenna interface as in claim 9, wherein the forming of the aperture comprises the step of:

cutting the aperture firstly as a rectangular parallelepiped in the first dielectric substrate so that one half of the number of the arms respectively terminate on opposite rectangular sides, so that the two other opposite sides are without arm terminations.

11. A method of constructing the direction finding antenna interface as in claim 8, comprising the steps of:

forming the second dielectric substrate in a shape upon which the stripline feed circuit/transformer and arithmetic network are disposed; and etching simultaneously the stripline feed circuit/-transformer and the arithmetic network upon the second dielectric so that the step of electrically connecting the stripline feed circuit/transformer to the arithmetic network is already accomplished by appropriate etching means.

* * * * *